United States Patent
Yamamura

(10) Patent No.: US 7,948,788 B2
(45) Date of Patent: May 24, 2011

(54) METHOD FOR DRIVING FERROELECTRIC MEMORY DEVICE, FERROELECTRIC MEMORY DEVICE, AND ELECTRONIC EQUIPMENT

(75) Inventor: Mitsuhiro Yamamura, Suwa (JP)

(73) Assignee: Seiko Epson Corporation (JP)

( * ) Notice: Subject to any disclaimer, the term of this patent is extended or adjusted under 35 U.S.C. 154(b) by 141 days.

(21) Appl. No.: 12/486,947

(22) Filed: Jun. 18, 2009

(65) Prior Publication Data

US 2010/0008121 A1 Jan. 14, 2010

(30) Foreign Application Priority Data

Jul. 10, 2008 (JP) ................................. 2008-180380

(51) Int. Cl.
*G11C 11/22* (2006.01)
*G11C 7/00* (2006.01)
(52) U.S. Cl. .................................. 365/145; 365/189.04
(58) Field of Classification Search .................. 365/145, 365/189.04, 189.11
See application file for complete search history.

(56) References Cited

U.S. PATENT DOCUMENTS

| | | | |
|---|---|---|---|
| 6,606,261 B2 * | 8/2003 | Gudesen et al. | 365/145 |
| 2003/0235066 A1 * | 12/2003 | Forbes | 365/145 |

FOREIGN PATENT DOCUMENTS

| | | |
|---|---|---|
| JP | 2001-331371 | 11/2001 |
| JP | 2003-91988 | 3/2003 |

* cited by examiner

*Primary Examiner* — Anh Phung
(74) *Attorney, Agent, or Firm* — Harness, Dickey & Pierce, P.L.C.

(57) ABSTRACT

A method for driving a ferroelectric memory device having a plurality of memory cells that store data and a memory cell for flag is provided. The method includes, upon writing to the plurality of memory cells, the steps of: reading data from the plurality of memory cells and the memory cell for flag; judging as to whether the data readout from the memory cell for flag is specified data; overwriting write data to the plurality of memory cells, and writing reverse data of the specified data to the memory cell for flag, when the data readout from the memory cell for flag is the specified data; and rewriting the data readout from the plurality of memory cells to the plurality of memory cells, and writing the reverse data to the memory cell for flag, when the data readout from the memory cell for flag is the reverse data.

11 Claims, 7 Drawing Sheets

METHOD FOR DRIVING FERROELECTRIC MEMORY DEVICE, FERROELECTRIC MEMORY DEVICE, AND ELECTRONIC EQUIPMENT

The entire disclosure of Japanese Patent Application No. 2008-180380, filed Jul. 10, 2008, is expressly incorporated by reference herein.

BACKGROUND

1. Technical Field

The present invention relates to methods for driving ferroelectric memory devices, and more particularly, to methods for driving ferroelectric memory devices that store data set with readout restriction.

2. Related Art

A ferroelectric memory device (FeRAM: Ferroelectric Random Access Memory) is a memory device that uses the property (remnant polarization property) of a ferroelectric film in which the film is polarized by an electric filed applied externally, and the polarization remains even when the external electric field is removed. By changing the direction of electric field, the direction of polarization of ferroelectrics changes, whereby data can be rewritten.

On the other hand, the number of readout operations of a memory device may be restricted in view of management of data to be stored. For example, depending on the confidentiality of stored data, the data may require to be managed with such a limitation that allows data readout only once.

For example, Japanese Laid-open Patent Application JP-A-2003-91988 (Patent Document 1) describes a system that uses a ferroelectric memory device whose data stored in a memory can be automatically erased after the data has been read out once.

A memory device equipped with the function to erase information immediately after the information has been readout, as described in Patent Document 1, may be compared to an attaché case for carrying confidential documents. When information stored in the memory device is highly confidential, a state in which the information remains within the memory device even after the information has been readout corresponds to a state in which, even after confidential document has been removed, a copy of the confidential document remains in the attaché case. This increases the danger of information leakage, and may lead to a failure of the control of information. In this respect, in the system described in Patent Document 1, the memory device is equipped with the function to "have confidential document in the attaché case non-existing after the confidential document has been removed" such that the memory device is provided with a role of an attaché case for safely carrying confidential document.

However, information stored in a ferroelectric memory device can be readily rewritten because of its own characteristic as a memory device. For example, referring to the example described above, this may be compared to a situation in which, when new confidential document is placed in the attaché case, the confidential document that has been in the attaché case is erased.

Therefore, methods that are capable of managing confidential information while preventing elimination of the confidential information are desired to be examined.

SUMMARY

In accordance with an advantage of some aspects of embodiments of the present invention, there is provided a method for driving a ferroelectric memory device, which is capable of restricting readout of stored data, while preventing unread data from being destroyed (overwritten).

(1) In accordance with an embodiment of the invention, there is provided a method for driving a ferroelectric memory device having a plurality of memory cells that store data and a memory cell for flag. Upon writing to the plurality of memory cells, the method includes the steps of:

reading the plurality of memory cells and the memory cell for flag;

judging as to whether the data readout from the memory cell for flag is specified data;

overwriting write data to the plurality of memory cells and writing reverse data of the specified data to the memory cell for flag, when the data readout from the memory cell for flag is the specified data; and rewriting the data readout from the plurality of memory cells to the plurality of memory cells, and writing the reverse data to the memory cell for flag, when the data readout from the memory cell for flag is the reverse data.

According to the driving method described above, unread data can be prevented from being destroyed (overwritten).

For example, the method for driving a ferroelectric memory device may be a driving method that includes providing an output indicative of whether the data stored in the memory cell for flag is the specified data or the reverse data. According to the driving method described above, the state of stored data can be recognized according to the result of output.

Preferably, upon reading the plurality of memory cells, the driving method may include the steps of: reading the plurality of memory cells and the memory cell for flag; writing data unrelated to the data readout from the plurality of memory cells to the plurality of memory cells and writing the specified data to the memory cell for flag. According to such a driving method, unread data can be prevented from being destroyed (overwritten), while restricting readout of stored data.

(2) A ferroelectric memory device in accordance with an embodiment of the invention includes a plurality of memory cells and a memory cell for flag, wherein the memory cell for flag stores reverse data of specified data when data stored in the plurality of memory cells is unread, and stores the specified data when data stored in the plurality of memory cells has already been read out. The plurality of memory cells may store data written based on the data readout from the memory cell for flag at the time of writing to the plurality of memory cells. The data written based on the data readout from the memory cell for flag may be new data written when the data readout from the memory cell for flag is the specified data, or data rewritten when the data readout from the memory cell for flag is the reverse data. According to such a structure, unread data can be prevented from being destroyed (overwritten), while restricting readout of stored data.

For example, the ferroelectric memory device may be a ferroelectric memory device having an output section that provides an output indicative as to whether the data readout from the memory cell for flag is the specified data. According to such a structure, the state of stored data can be recognized by the output.

(3) Electronic equipment in accordance with an embodiment of the invention includes a ferroelectric memory device that is driven by the method for driving a ferroelectric memory device described above, or the ferroelectric memory device described above. It is noted here that the electronic equipment refers to equipment in general that is equipped with a ferroelectric memory device in accordance with the embodiment and performs predetermined functions. Without any particular limitation to its structure, the electronic equipment may include any devices that require a memory device, such as, for example, computer devices in general, cellular phones, PHS, PDA, electronic note books, IC cards and the like equipped with the ferroelectric memory device described above.

For example, the electronic equipment may be electronic equipment that has a display section to indicate as to whether the data readout from the memory cell for flag is the specified data. According to such a structure, the state of the stored data can be recognized by the display section.

BRIEF DESCRIPTION OF THE DRAWINGS

FIG. 3 is a timing chart of the readout operation of the ferroelectric memory device in accordance with Embodiment 1.

DESCRIPTION OF EXEMPLARY EMBODIMENTS

Preferred embodiments of the invention are described in detail below with reference to the accompanying drawings. It is noted that components having the same function shall be appended with the same or related reference numbers, and their description shall not be repeated.

Embodiment 1

Figure 1:
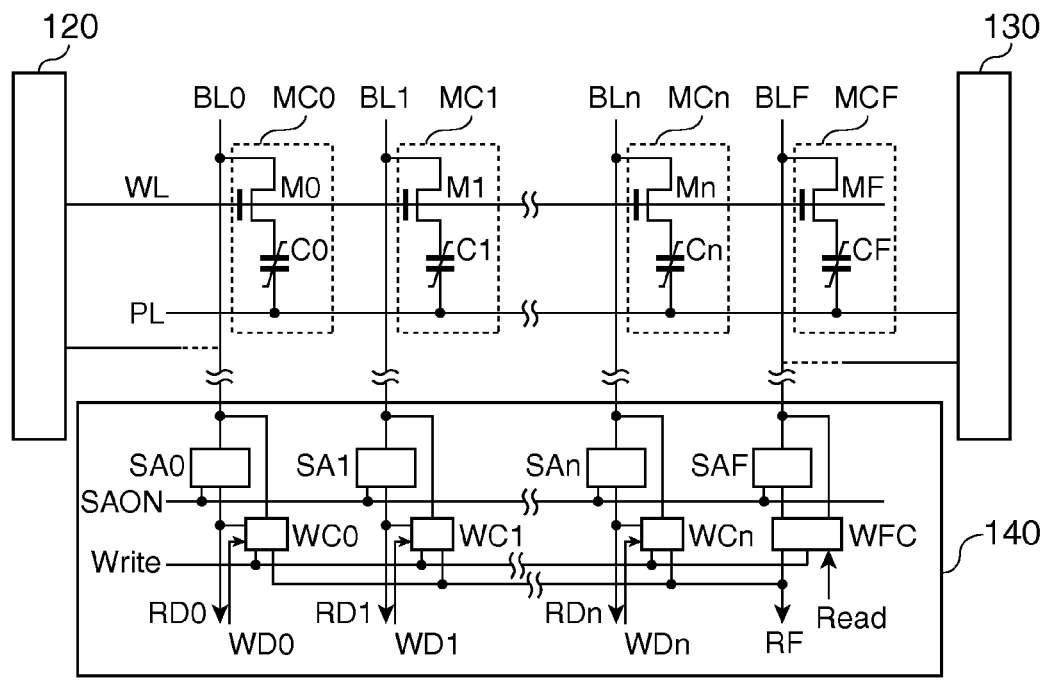
FIG. 1 is a circuit diagram of the structure of a ferroelectric memory device in accordance with Embodiment 1 of the invention.
Figure 2:
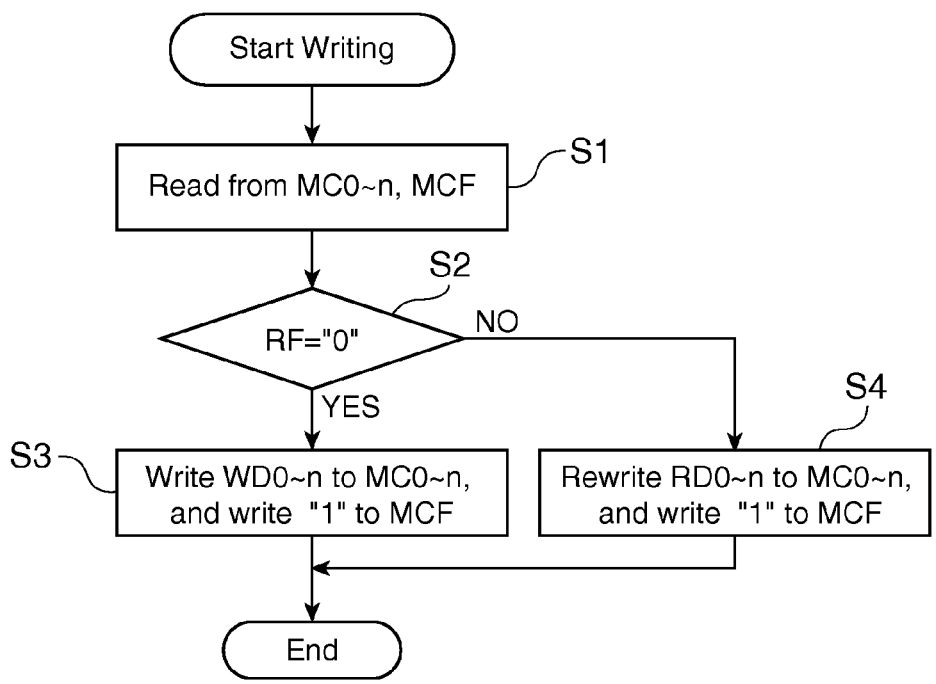
FIG. 2 is a flow chart of a write operation of the ferroelectric memory device in accordance with Embodiment 1 of the invention.
Figure 3A:
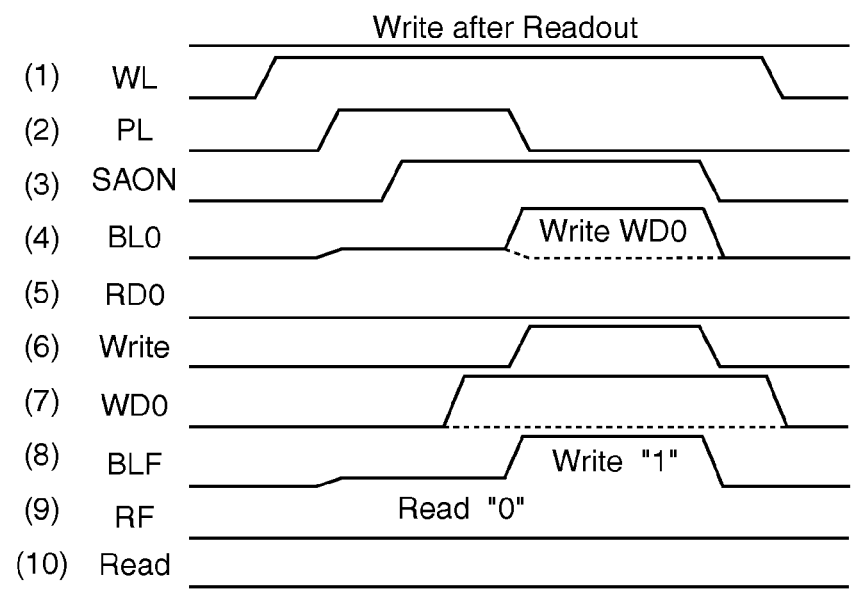
FIG. 3A and FIG. 3B are timing charts of the write operation of the ferroelectric memory device in accordance with Embodiment 1.
Figure 3B:
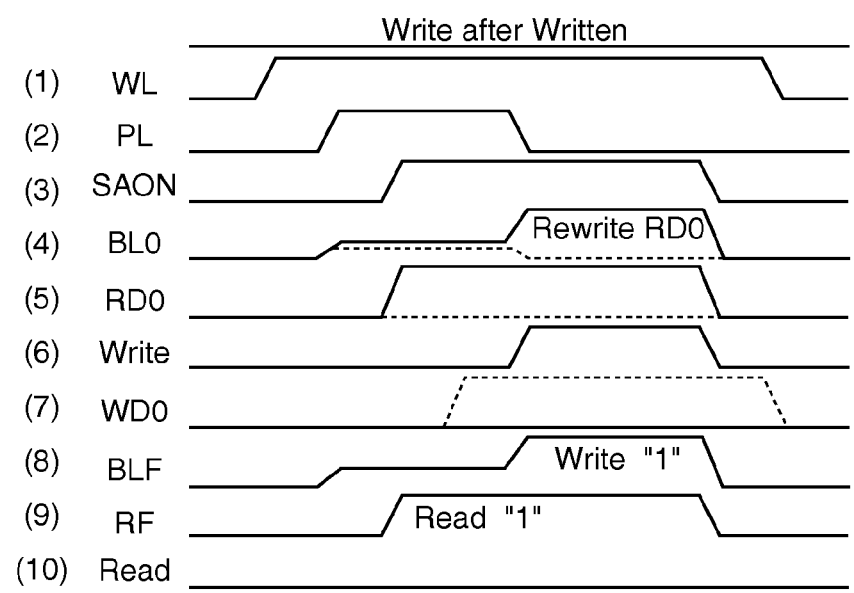
Figure 4:
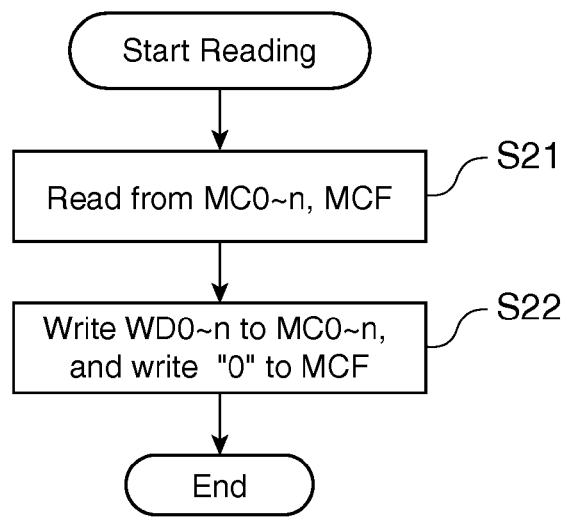
FIG. 4 is a flow chart of a readout operation of the ferroelectric memory device in accordance with Embodiment 1.
Figure 5:
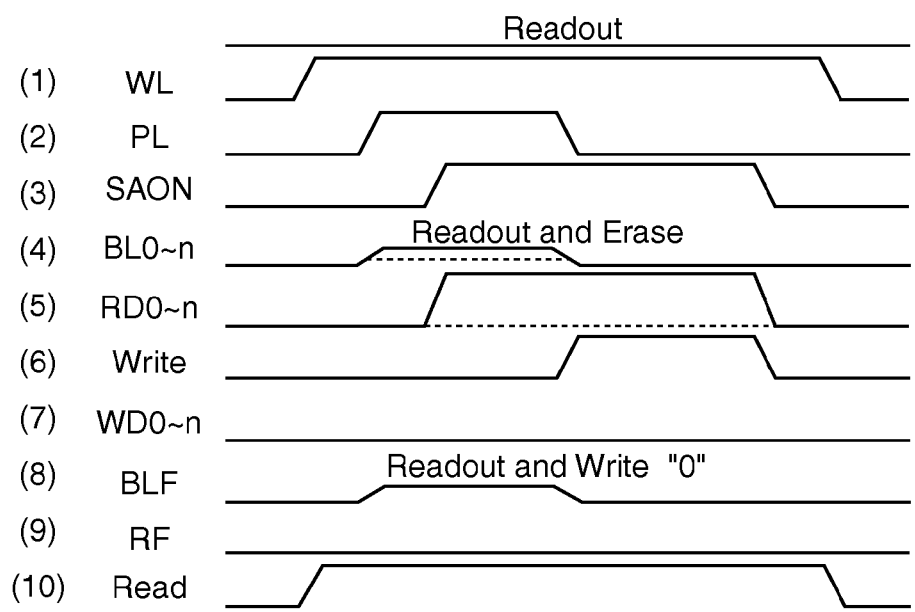

FIG. 1 is a circuit diagram of the structure of a ferroelectric memory device in accordance with an embodiment of the invention. FIG. 2 is a flow chart of a write operation of the ferroelectric memory device in accordance with the present embodiment. FIG. 3A and FIG. 3B are timing charts of the write operation of the ferroelectric memory device in accordance with the present embodiment. FIG. 4 is a flow chart of a readout operation of the ferroelectric memory device in accordance with the present embodiment. FIG. 5 is a timing chart of the readout operation of the ferroelectric memory device in accordance with the present embodiment.

As shown in FIG. 1, the ferroelectric memory device includes a memory cell array and peripheral circuit sections (120, 130, 140, etc.). The memory cell array includes a data storage region and a flag region, as described in detail below.

The data storage region of the memory cell array is formed from a plurality of memory cells MC (MC0-MCn), wherein each of the memory cells MC is disposed at an intersection between a word line WL and a bit line BL (BL0-BLn). In this embodiment, a 1T1C cell is described as an example. It is noted that FIG. 1 only shows memory cells in one row extending in the direction of the word line WL, but it goes without saying that the memory cells MC are arranged in an array configuration.

In this case, each data is stored by a transistor M (M0-Mn) and a ferroelectric capacitor C (C0-Cn) that are connected in series between the bit line BL and a plate line PL. Also, the word lines WL are controlled by a word line control section 120 that composes the peripheral circuit, and the plate lines PL are controlled by a plate line control section 130 that composes the peripheral circuit. By the aforementioned controls, data stored in the memory cells MC are readout onto the plurality of bit lines BL, or externally supplied data are stored in the memory cells MC through the bit lines BL. Such reading and writing operations are performed by a bit line control section 140.

In the present embodiment, one memory cell MCF in the memory cell array is used as the flag region. It is noted that FIG. 1 shows only one memory cell for flag MCF, but all memory cells connected to a bit line BLF (a memory cell row) may be used as memory cells for flag MCF.

The bit line control section 140 includes a plurality of sense amplifiers (readout circuit) SA (SA0-SAn), and write circuits WC (WC1-WCn). The sense amplifier SA is connected to the bit line BL and a SAON line and can be activated by a SAON signal, thereby comparing a potential on the bit line BL with a reference potential, amplifying the comparison result, and outputting data stored in the memory cell MC as readout data RD (RD0-RDn). It is noted that the sense amplifier SA does not need to be directly connected to the bit line BL, and a switching MISFET and a variety of other circuits may be connected between the two. Also, a sense amplifier may be shared by a plurality of memory cell rows. It is noted that names of signal lines and signals thereon may be indicated by the same codes, as was done above.

The write circuit WC is connected to the bit line BL and a Write line, and is activated by a Write signal, thereby writing write data WD (WD0-WDn) through the bit line BL to the memory cell MC. Moreover, the write circuit WC is also connected to the sense amplifier SA, and is structured to be capable of rewriting readout data RD.

It is noted that the memory cell for flag MCF is connected to a sense amplifier for flag SAF and a write circuit for flag WFC through the bit line BLF. The sense amplifier for flag SAF is activated by a SAON signal, thereby comparing a potential on the bit line BLF with a reference potential, amplifying the comparison result and outputting data (flag) stored in the memory cell MCF to the write circuit WCF. The write circuit for flag WCF is activated by a Write signal, and writes specified data based on a Read signal through the bit line BL to the memory cell for flag MCF. For example, when the Read signal is "0," data "1" is written to the memory cell for flag MCF; and when the Read signal is "1," data "0" is written to the memory cell for flag MCF. Also, the write circuit for flag WCF outputs a flag signal RF based on the Read signal. For example, when the Read signal is "0," data (flag) stored in the memory cell MCF is outputted as a flag signal RF; and when the Read signal is "0," specified data (for example, "0") is outputted as a flag signal RF.

The flag signal line RF is connected to the write circuit WC (WC1-WCn), and whether readout data RD is to be read out or write data WD is to be written is controlled by the flag signal RF.

More specifically, when data in the data storage region that stores data set with a readout restriction is unread, a flag "1" is stored in the memory cell for flag MCF; and after the data has been readout, a flag "0" is stored in the memory cell for flag MCF. When a write signal is inputted, the data in the memory cell for flag MCF is checked. When the flag is "1," the data is unread, and therefore readout data RD is rewritten; and when the flag is "0," the data has already been read, and therefore writing (overwriting) is permitted. By the operation described above, destruction (overwriting) of unread data is prevented.

A write operation for (a method for driving) the ferroelectric memory device in accordance with the present embodiment is described below in detail with reference to FIG. 2 and FIGS. 3A and 3B.

As shown in FIG. 2, when a write operation starts (Start), the memory cells MC0-MCn and the memory cell for flag MCF are read (step S1). As a result, it is judged as to whether the flag signal RF that is a signal readout from the memory cell MCF is "0" (step S2) or not. When it is "0" (Yes), new write data WD (new data, WD0-WDn) are written (overwritten) to the memory cells MC0-MCn, "1" is written to the memory cell for flag MCF (step S3), and the process is finished (End). On the other hand, when the flag signal RF that is a signal readout from the memory cell MCF is "1" (No), readout data RD0-RDn are rewritten to the memory cells MC0-MCn, "1" is written to the memory cell for flag MCF (step S4), and the process is finished (End).

As shown in FIG. 3A, in a "write after readout" operation, in other words, while executing the steps S1, S2 and S3, the word line WL, the plate line PL and the SAON signal are sequentially raised in response to a chip select signal (not shown), thereby starting the readout operation [(1)-(3)]. By this readout operation, potentials on the bit line BL0 and BLF change [(4), (8)], and RD0 (for example, "0" data) and RF are read out [(5), (9)]. When RF is "0," write data WD (WD0-WDn) are written, based on a Write signal, through the bit line BL0, etc., to the memory cells [(4), (6), (7)]. On the other hand, "1" is written to the memory cell for flag through the bit line for flag BLF [(8)]. During the steps described above, the Read signal is at L level [(10)].

Also, as shown in FIG. 3B, in a "write after written" operation, in other words, while executing the steps S1, S2 and S4, the word line WL, the plate line PL and the SAON signal are sequentially raised in response to a chip select signal (not shown), thereby starting the readout operation [(1)-(3)]. By this readout operation, potentials on the bit line BL0 and BLF change [(4), (8)], and RD0 and RF are readout [(5), (9)]. When RF is "1," readout data RD0-RDn are rewritten (Re-Write) [(4), (6), (7)]. On the other hand, "1" is written to the memory cell for flag through the bit line for flag BLF [(8)]. During the steps described above, the Read signal is at L level [(10)].

In a readout operation, as shown in FIG. 4, when a readout operation starts (Start), the memory cells MC0-MCn are read out (step S21), and then WD0-WDn are written in order to erase data in the memory cells MC0-MCn, "0" is written to the memory cell for flag MCF (step S22), and the process is finished (End). It is noted that the aforementioned data erasure can be performed by rewriting with all WD0-WDn being set to "0." In this example, data erasure of the memory cells MC0-MCn is accomplished by writing "0," but the same can be accomplished by rewriting data unrelated to the readout data RD0-RDn. For example, "1" may be written, or random data may be rewritten.

As shown in FIG. 5, in the write operation described above, a Read signal rises in response to a chip select signal (not shown), and then the word line WL, the plate line PL and the SAON signal are sequentially raised, thereby starting the readout operation [(10), (1)-(3)]. By this readout operation, potentials on the bit lines BL0-BLn, and BLF change [(4), (8)], and RD0-RDn are read out [(5)]. It is noted here that, in response to the rising of the Read signal, RF is set to "0" regardless of the potential on the BLF [(9)]. Because RF is "0," write data WD (for example, all of them being "0") that are unrelated to the readout data RD0-RDn are written, based on a Write signal, through the bit line BL0, etc., to the memory cells [(4), (6), (7)]. On the other hand, "0" is also written to the memory cell for flag through the bit line for flag BLF [(8)].

In this manner, in accordance with the present embodiment, destruction (overwriting) of unread data can be prevented, while restricting readout of stored data.

Also, in accordance with an aspect of the present embodiment, a flag signal RF may be outputted outside of the ferroelectric memory device (semiconductor chip). In this case, the flag signal RF can be used in a system or electronic equipment that incorporates the ferroelectric memory device in accordance with the present embodiment. For example, a system (for example, a micro computer) may receive the flag signal RF as information indicative of whether data is unread or has already been read, or whether a writing operation has succeeded or failed, and can determine the next action to control the ferroelectric memory device in accordance with the present embodiment based on the information. It is noted that, in accordance with the present embodiment, "1" data is used as the flag indicative of a state being unread, but "0" data may be used as the flag indicative of a state of being unread, without any particular limitation to the above.

Embodiment 2

The embodiment 1 is described above using a 1T1C type memory cell as an example, but the invention is also applicable to a 2T2C type memory cell.

Figure 6:
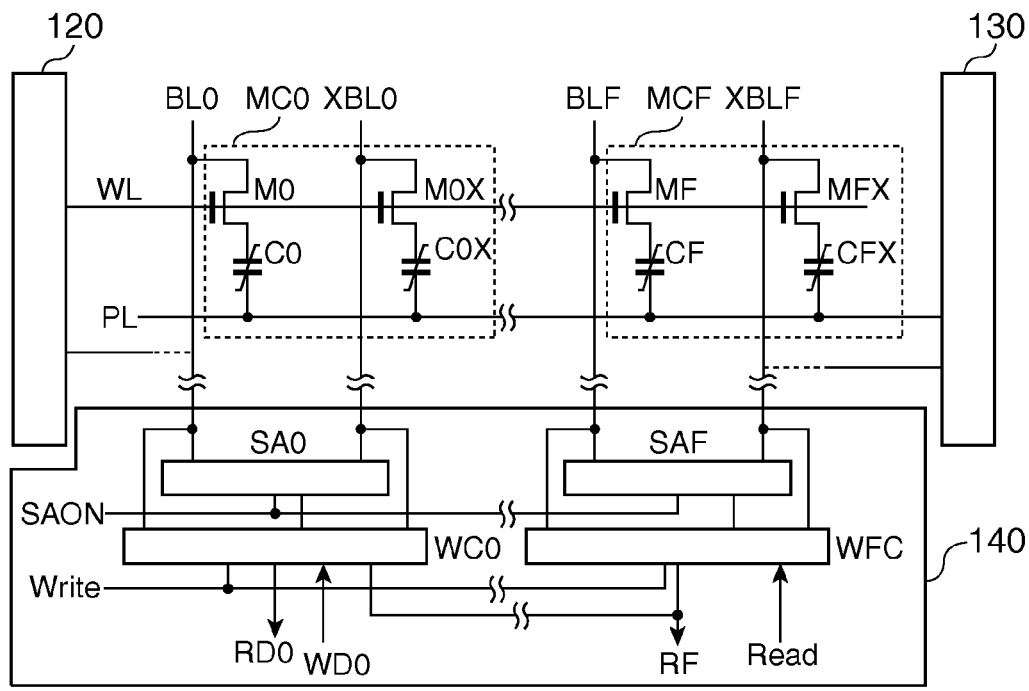
FIG. 6 is a circuit diagram of the structure of a ferroelectric memory device in accordance with Embodiment 2 of the invention.
Figure 7:
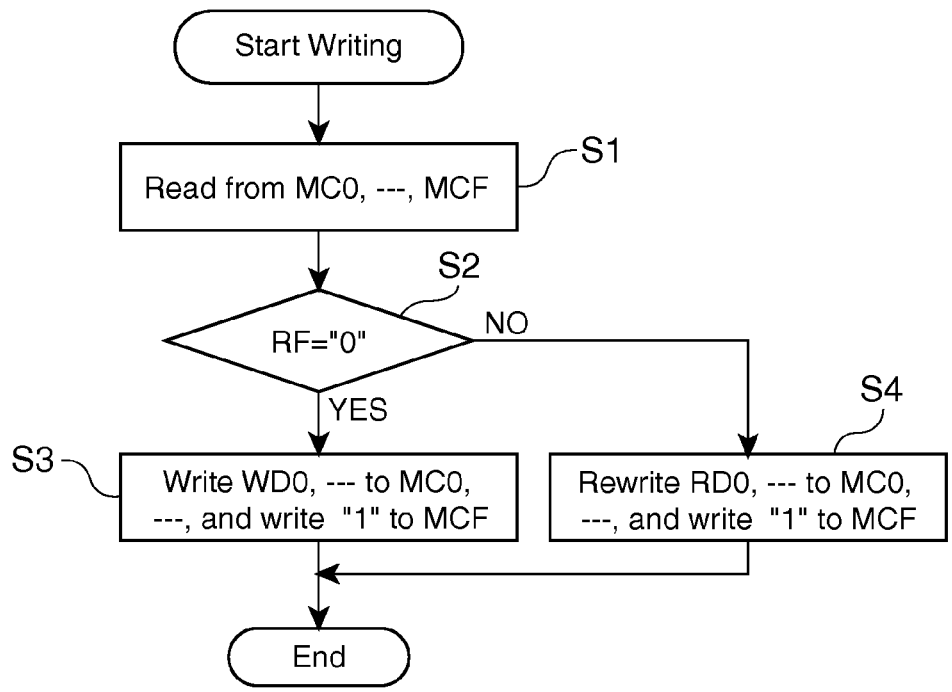
FIG. 7 is a flow chart of a write operation of the ferroelectric memory device in accordance with Embodiment 2.
Figure 8A:
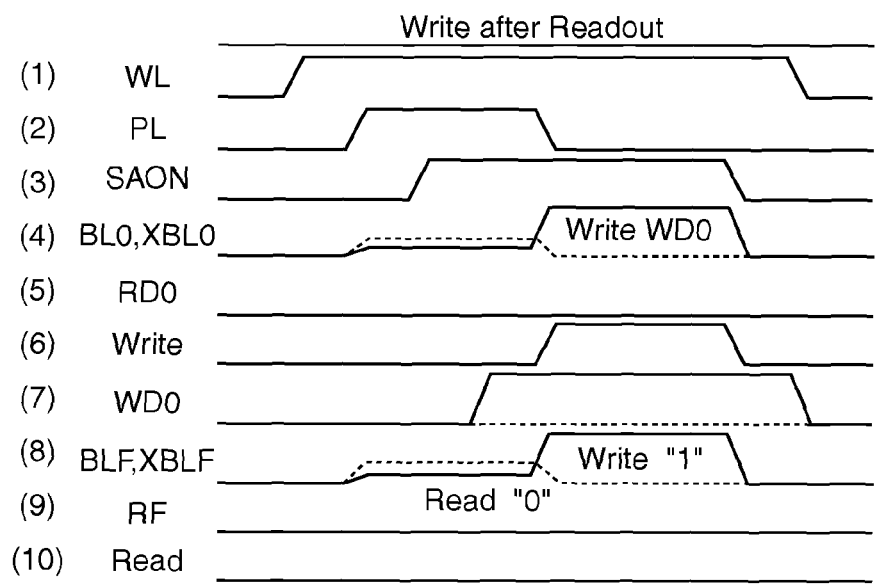
FIG. 8A and FIG. 8B are timing charts of the write operation of the ferroelectric memory device in accordance with Embodiment 2.
Figure 8B:
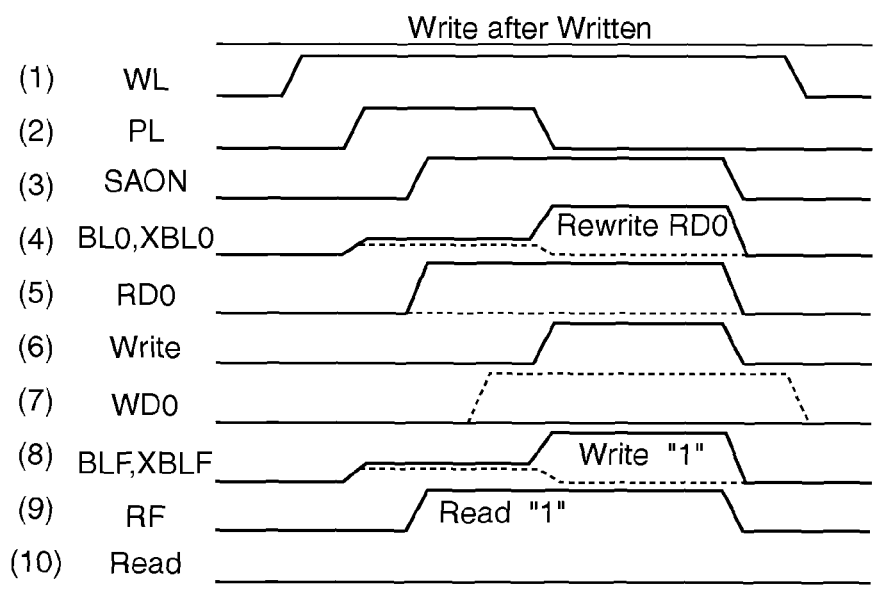
Figure 9:
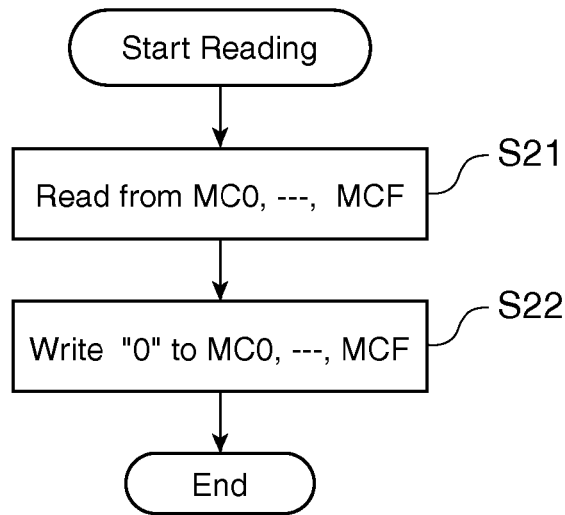
FIG. 9 is a flow chart of a readout operation of the ferroelectric memory device in accordance with Embodiment 2.
Figure 10:
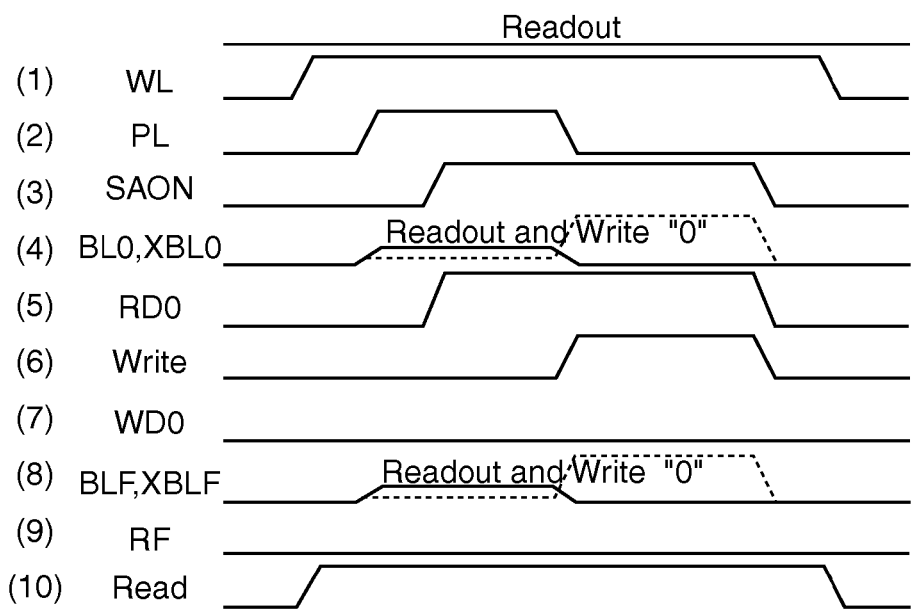
FIG. 10 is a timing chart of the readout operation of the ferroelectric memory device in accordance with Embodiment 2.

FIG. 6 is a circuit diagram of the structure of a ferroelectric memory device in accordance with an embodiment of the invention. FIG. 7 is a flow chart of a write operation of the ferroelectric memory device in accordance with present embodiment. FIGS. 8A and 8B are timing charts of the write operation of the ferroelectric memory device in accordance with the present embodiment. FIG. 9 is a flow chart of a readout operation of the ferroelectric memory device in accordance with the present embodiment. FIG. 10 is a timing chart of the readout operation of the ferroelectric memory device in accordance with the present embodiment. It is noted that components having the same functions as those of Embodiment 1 (FIG. 1-FIG. 5) are appended with the same or related reference numbers, and their description shall not be repeated.

As shown in FIG. 6, in the case of a 2T2C type, each data is stored by two transistors (M0, M0X) and two ferroelectric capacitors (C0, C0X) connected to bit lines BL and XBL, respectively.

In the event of a write operation, complementary data are written to two ferroelectric capacitors C0 and C0X by a write circuit WC0. In the event of a readout operation, a sense amplifier SA0 compares and amplifies the amounts of charge read out from the capacitors, thereby judging as to whether the ferroelectric capacitors (C0 and C0X) store "1" and "0" or store "0" and "1", respectively, and outputs output data RD0 ("1" or "0"). It is noted that other structures of the 2T2C type memory cell are similar to those of the 1T1C type memory cell in accordance with Embodiment 1 except that complementary data are written to and readout from the two ferroelectric capacitors (C0, C0X), and therefore their detailed description shall be omitted.

Therefore, in accordance with the present embodiment, one memory cell MCF among the memory cell array is used as a flag region, and a flag is stored by two transistors (MF and MFX) and two ferroelectric capacitors (CF and CFX) connected to bit lines BLF and XBLF, respectively.

As shown in FIG. 7, in the case of the 2T2C type memory cell, the flow chart of its write operation is generally the same as that of Embodiment 1 described above (see FIG. 2). More specifically, when a write operation starts (Start), the memory cells MC0-MCn and the memory cell for flag MCF are read out (step S1), and it is judged as to whether the flag signal RF that is a signal readout from the memory cell MCF is "0" (step S2) or not. When it is "0" (Yes), write data WD (WD0-WDn) are written to the memory cells MC0-MCn, "1" is written to the memory cell for flag MCF (step S3), and the process is finished (End). On the other hand, when the flag signal RF that is a signal readout from the memory cell MCF is "1" (No), readout data RD0-RDn are rewritten to the memory cells MC0-MCn, "1" is written to the memory cell for flag MCF (step S4), and the process is finished (End).

Also, as shown in FIGS. 8A and 8B, in the case of the 2T2C type memory cell, timing charts of a write operation of the ferroelectric memory device are also generally the same as those of Embodiment 1 described above (see FIGS. 3A and 3B) except that potential changes on the bit lines XBL0 and XBLF occur complementary to those on the bit lines BL0 and BLF, respectively.

A read operation of the 2T2C type memory cell, as shown in FIG. 9 and FIG. 10, is also generally the same as that of Embodiment 1 (see FIG. 4 and FIG. 5) except that potential changes on the bit lines XBL0 and XBLF occur complementary to those on the bit lines BL0 and BLF, respectively.

In this manner, in accordance with the present embodiment, destruction (overwriting) of unread data can be prevented while restricting readout of stored data, like Embodiment 1.

Also, in the present embodiment, the flag signal RF may be outputted outside the ferroelectric memory device (semiconductor chip), like Embodiment 1.

It is noted that, in accordance with the present embodiment, "1" data is used as the flag indicative of a state being unread, but "0" data may be used as the flag indicative of an unread state, without any particular limitation to the above.

Furthermore, in accordance with Embodiment 1 and Embodiment 2, the sense amplifier SA and the write circuit WC are not limited to any particular internal structure, and a variety of types can be used. For example, for the sense amplifier (readout circuit) SA, a current latch type that outputs waveforms similar to those of the timing charts described above, a BGS (bit line ground sense) type, a current mirror type, and other readout circuits may also be used. However, the readout circuit may preferably have a structure in which its input and output are separated from each other. A readout circuit with its input and output being integrated normally automatically performs a rewriting operation after a readout operation, such that, thereafter, rewritten data needs to be destroyed. Accordingly, from the circuit and control point of view, input and output of the readout circuit may preferably be independently controlled.

Also, in the readout operation in accordance with Embodiment 1 (see FIG. 4 and FIG. 5), "0" is written to all of the memory cells MC0-MCn to erase data stored therein. However, the write step may be omitted. More specifically, after destructive readout of ferroelectric memory cells, in other words, after readout of the memory cells, all the memory cells assume a state in which "0" data is written. This function may be used to speed up the readout operation.

Figure 11:
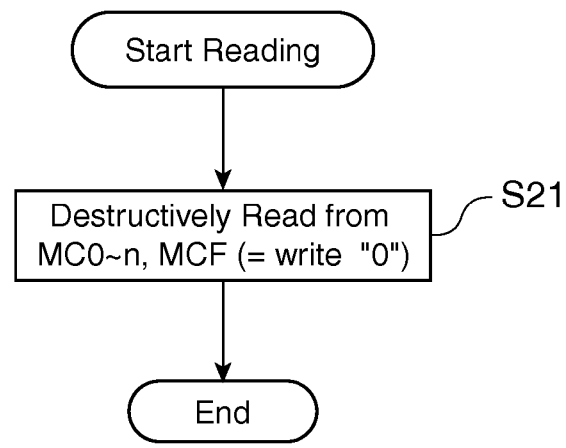
FIG. 11 is a flow chart of another example of a readout operation of the ferroelectric memory device in accordance with Embodiment 1 of the invention.
Figure 12:
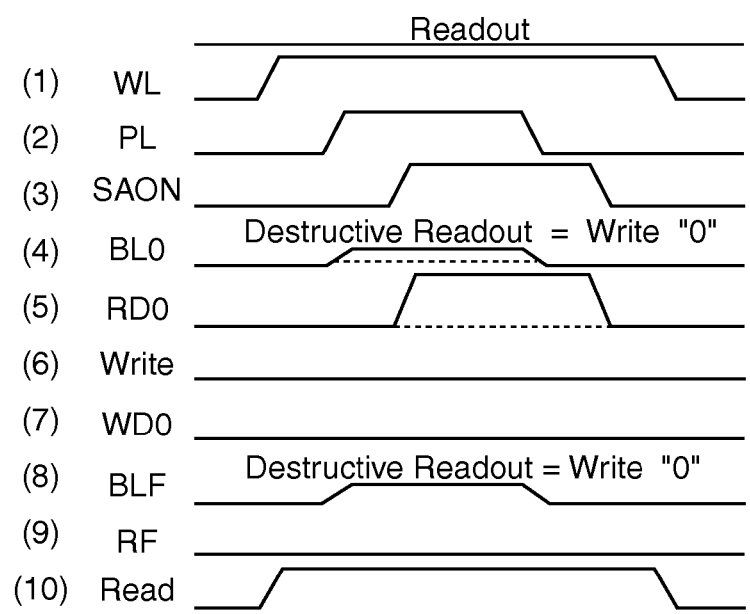
FIG. 12 is a timing chart of the other example of the readout operation of the ferroelectric memory device in accordance with Embodiment 1 of the invention.

FIG. 11 is a flow chart of another example of a readout operation of the ferroelectric memory device in accordance with Embodiment 1 of the invention. FIG. 12 is a timing chart of the other example of the readout operation of the ferroelectric memory device in accordance with Embodiment 1 of the invention.

As shown in FIG. 11, in the event of a readout operation, when reading starts (Start), the memory cells MC0-MCn are destructively read out (step S21), thereby writing "0" to all of the memory cells. In this instance, "0" is also written to the memory cell for flag MCF. In this case, as shown in FIG. 12, a Write signal does not rise [(6)]. It is noted that operation waveforms of the other signals are generally the same as those of Embodiment 1 (see FIG. 5).

It is noted that embodiment examples and application examples described above with reference to the embodiments of the invention may be used through appropriately combining them, or with modifications or improvements added thereto depending on the usages, and the invention is not limited to the description of the embodiments presented above.

Furthermore, the ferroelectric memory devices in accordance with the embodiments described above may be incorporated in a variety of electronic equipment. The ferroelectric memory device in accordance with the present embodiment can be incorporated in a variety of equipment, for example, IC cards, data carrier media, systems that presuppose transfer of original data, without limitations to any particular electronic equipment. In particular, the present embodiments are useful when applied to equipment that transfers original confidential data without leaving copies thereof, in other words, equipment that realizes a state in which confidential data exists only in a transfer media during its transfer. Such equipment may be added with the function in accordance with the invention in which ferroelectric memory devices cannot be overwritten without reading out information stored therein. As a result, confidential data can be prevented from being accidentally erased, and therefore can be secured.

Moreover, electronic equipment that incorporates therein the ferroelectric memory device that outputs the flag signal RF in accordance with the embodiments described above can present the received flag signal RF to the user of the electronic equipment. For example, when the flag "1" indicative of a state of being unread is stored, a red lamp may be flashed, thereby allowing a visual confirmation of the state of being unread or already having been read. Also, the electronic equipment may be provided with a structure that enables, in the event of a writing operation, confirmation as to whether a flag being "0" is stored or not with the aforementioned display or sound. For example, when writing of new data has succeeded, a blue lamp may be flashed, or when writing of new data has failed, an alarm sound indicating an error may be generated. In this manner, by using different indication modes according to flag data (flashing a red lamp or a blue lamp, turning off a lamp, generating an alarm sound indicating an error, muting a sound and the like), the user can learn as to whether data within the ferroelectric memory device has been unread, whether writing of new data has been successful, and the like.

What is claimed is:

1. A method for driving a ferroelectric memory device having a plurality of memory cells that store data and a memory cell for flag, the method comprising, upon writing to the plurality of memory cells, the method comprising:
    reading data from the plurality of memory cells and the memory cell for flag;
    judging as to whether the data read out from the memory cell for flag is specified data;
    overwriting write data to the plurality of memory cells and writing reverse data of the specified data to the memory cell for flag, when the data read out from the memory cell for flag is the specified data; and
    rewriting the data read out from the plurality of memory cells to the plurality of memory cells, and writing the reverse data to the memory cell for flag, when the data read out from the memory cell for flag is the reverse data.

2. The method for driving the ferroelectric memory device according to claim 1, wherein the ferroelectric memory device provides an output indicative of whether the data stored in the memory cell for flag is the specified data or the reverse data.

3. The method for driving the ferroelectric memory device according to claim 1, upon reading the plurality of memory cells, the method further comprising:
    reading the plurality of memory cells and the memory cell for flag; and
    writing data unrelated to the data read out from the plurality of memory cells to the plurality of memory cells and writing the specified data to the memory cell for flag.

4. A ferroelectric memory device, comprising:
    a plurality of memory cells and a memory cell for flag, wherein the memory cell for flag stores reverse data of specified data when data stored in the plurality of memory cells is unread, and stores the specified data when data stored in the plurality of memory cells has already been read.

5. The ferroelectric memory device according to claim 4, wherein the plurality of memory cells store data written based on the data read out from the memory cell for flag at the time of writing to the plurality of memory cells.

6. The ferroelectric memory device according to claim 5, wherein the data written based on the data read out from the memory cell for flag is new data written when the data read out from the memory cell for flag is the specified data, or data rewritten when the data read out from the memory cell for flag is the reverse data.

7. The ferroelectric memory device according to claim 6, further comprising: an output section that provides an output indicative as to whether the data read out from the memory cell for flag is the specified data.

8. An electronic equipment comprising the ferroelectric memory device that is driven by the method for driving a ferroelectric memory device recited in claim 1.

9. The electronic equipment according to claim 8, further comprising: an indication section to indicate as to whether the data read out from the memory cell for flag is the specified data.

10. An electronic equipment comprising the ferroelectric memory device that is driven by the method for driving a ferroelectric memory device recited in claim 4.

11. The electronic equipment according to claim 10, further comprising: an indication section to indicate as to whether the data read out from the memory cell for flag is the specified data.

* * * * *